United States Patent [19]

Baba

[11] Patent Number: 4,593,958
[45] Date of Patent: Jun. 10, 1986

[54] SOCKET FOR BASELESS LAMP

[75] Inventor: Masaharu Baba, Yokohama, Japan

[73] Assignee: Kabushiki Kaisha Toshiba, Kawasaki, Japan

[21] Appl. No.: 743,807

[22] Filed: Jun. 12, 1985

[30] Foreign Application Priority Data

Jun. 14, 1984 [JP] Japan .............................. 59-88525[U]

[51] Int. Cl.⁴ .............................................. H01R 9/09
[52] U.S. Cl. ................. 339/17 D; 339/125 L; 339/127 R; 339/176 L
[58] Field of Search ............. 339/17 D, 119 L, 125 L, 339/127 R, 127 C, 176 L

[56] References Cited

U.S. PATENT DOCUMENTS

| 2,892,992 | 6/1959 | Grovemiller et al. | 339/127 R |
| 3,864,001 | 2/1975 | Millet | 339/127 R |
| 4,076,358 | 2/1978 | Taormina et al. | 339/127 R |
| 4,227,760 | 10/1980 | Witek, Jr. | 339/17 D |
| 4,365,396 | 12/1982 | Baba et al. | 339/176 L |
| 4,373,771 | 2/1983 | Cross et al. | 339/17 D |
| 4,412,716 | 11/1983 | Baba et al. | 339/176 L |

FOREIGN PATENT DOCUMENTS

| 244450 | 1/1966 | Austria | 339/127 R |
| 1489300 | 3/1969 | Fed. Rep. of Germany | 339/127 R |
| 2506942 | 8/1975 | Fed. Rep. of Germany | 339/127 R |

Primary Examiner—John McQuade
Attorney, Agent, or Firm—Cushman, Darby & Cushman

[57] ABSTRACT

A socket has a bulb insertion cavity into which a sealed section of a baseless lamp is inserted. The socket is mounted to a mounting base by being inserted through an insertion hole thereof and then turned in a predetermined direction. The socket has a pair of contact members disposed in the insertion cavity. Each contact member has a power supply terminal, and a contact protuberance is formed on the free end of the terminal. The protuberance has a flat top surface being in contact with a printed wiring on the mounting base, a first inclined side surface extending from the top surface toward the base end of the terminal, a second inclined side surface extending from the top surface in the turning direction of the socket, and third and fourth inclined side surfaces opposite to the first and second surfaces, respectively. The first and second surfaces are inclined more gently than the third and fourth surfaces.

5 Claims, 7 Drawing Figures

SOCKET FOR BASELESS LAMP

BACKGROUND OF THE INVENTION

This invention relates to a socket for a baseless lamp.

The baseless lamp, which is also referred to as a wedge base lamp, usually has a bulb with a sealed section formed at one end and a pair of leads folded along, and secured to, the outer surface of the sealed section and connected to a filament inside the bulb.

A socket, into which such a baseless lamp is inserted, has a cylindrical socket body made of a synthetic resin. The socket body has a bulb insertion cavity, into which the sealed section of the bulb is inserted, a flange formed on the outer periphery and clamp sections facing the flange. A mounting base, in which the socket is mounted, is clamped between the clamp sections and flange. A pair of contact members are inserted in the bulb insertion cavity. Each contact member has a pair of elastic contact portions which clamp the seal section of the bulb and are in elastic contact with the leads extending along the sealed section. Each contact member has a power supply terminal extending up to the top of the flange and in contact with a printed wiring formed on the mounting base.

The socket is inserted through a mounting hole formed in the mounting base and then turned in one direction. As a result, the mounting base is clamped between the clamp sections and the flange, whereby the socket body is mounted in the mounting base with the power supply terminals brought into contact with the printed wiring on the mounting base to form a power supply circuit.

In order to maintain a satisfactory contact between the end portion of the power supply terminal and printed wiring, an end portion of the power supply terminal is provided with a contact protuberance. The contact protuberance has a semispherical shape, so that it is brought into point contact with the printed wiring when it is urged thereagainst. The pressure of contact between the contact protuberance and printed wiring, therefore, is considerable. Thus, the printed wiring is liable to be damaged by the contact protuberance when the socket body inserted through the mounting hole of the mounting base is turned relative to the same.

Particularly, the printed wiring is formed from a copper foil printed on a polyester resin film. Therefore, with the rotation of the contact protuberance the copper foil is liable to be separated from the resin film, thus resulting in a contact failure.

Moreover, since the contact pressure between the protuberance and the printed wiring is relatively high, the operation of turning the socket requires a large force, thereby making the mounting of the socket troublesome.

SUMMARY OF THE INVENTION

The invention has been intended in light of the above, and its object is to provide a socket for a baseless lamp, which can be mounted in a mounting base without causing damage to or separation of the printed wiring thereon and thus eliminate the occurrence of a contact failure.

To achieve the above object, according to the present invention, the contact protuberance formed on the power supply terminal of each contact member has a flat top surface in contact with the printed wiring of the mounting base, a first inclined side surface extending from the flat top surface toward the base end of the power supply terminal, a second inclined side surface extending from the flat top surface in the direction of rotation of the socket body and third and fourth inclined side surfaces opposed to the first and second inclined side surfaces, respectively, the first and second inclined side surfaces being inclined more gently than the third and fourth inclined side surfaces.

With the socket according to the invention, the contact protuberance has the first and second inclined side surfaces which can be more readily elastically deformed to promote stress dispersion. For this reason, the pressure of contact between the contact protuberance and printed writing is reduced, and also the frictional resistance offered to the contact protuberance at the time of the mounting of the socket body is reduced. It is thus possible to eliminate or reduce damage to or separation of the printed wiring, thus reducing the possibility of contact failure and improving reliability.

BRIEF DESCRIPTION OF THE DRAWINGS

FIGS. 1 to 7 illustrate a socket for a baseless lamp according to an embodiment of the invention, in which:

FIG. 1 is a perspective view showing the socket and a baseless lamp to be inserted in the socket;

FIG. 2 is a plane view showing the socket;

FIG. 3 is a sectional view taken along line III—III in FIG. 2;

FIG. 4 is a perspective view showing a mounting base for mounting the socket therein;

FIG. 5 is an enlarged perspective view showing an end portion of a power supply terminal;

FIG. 6 is a sectional view taken along line VI—VI in FIG. 5; and

FIG. 7 is a sectional view taken along line VII—VII in FIG. 5.

DETAILED DESCRIPTION OF THE PREFERRED EMBODIMENT

An embodiment of the invention will now be described in detail with reference to the accompanying drawings.

Figure 1:
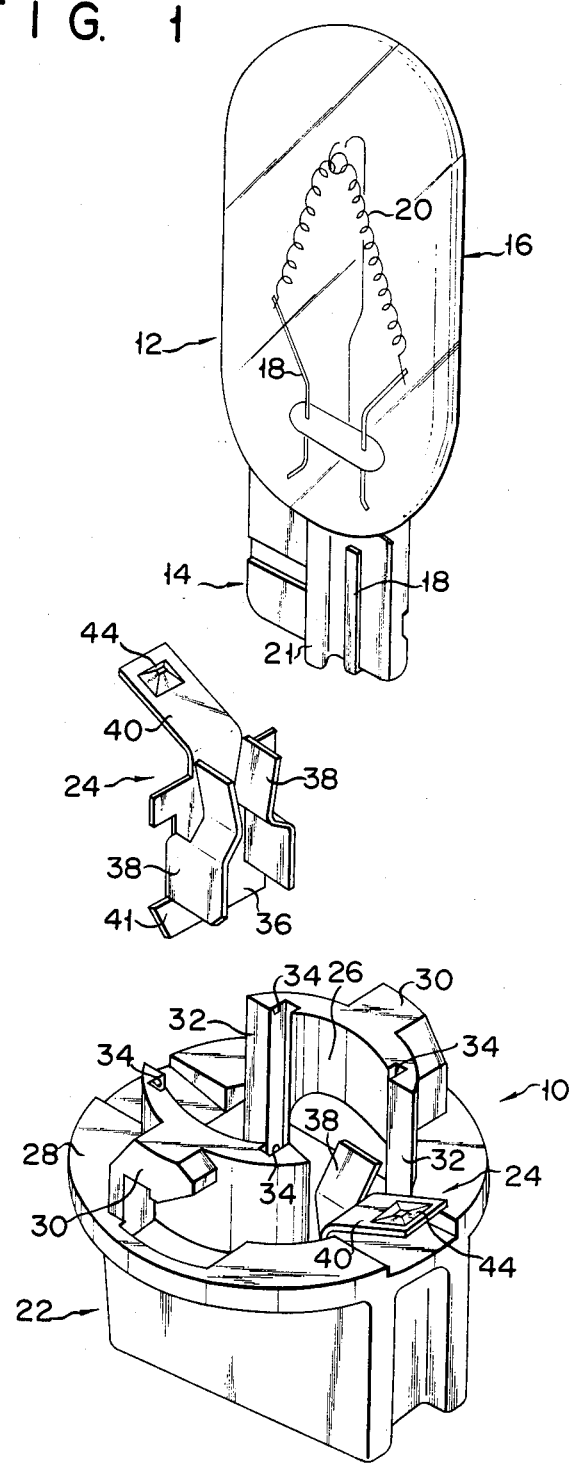

FIG. 1 shows a socket 10 according to the invention and a baseless lamp 12 to be inserted in the socket. The lamp 12 comprises a glass bulb 16 having a sealed section 14 formed at the lower end thereof. A pair of leads 18 are folded along the opposite sides of the sealed section 14 and connected to a filament 20 in the bulb 16. Reference numeral 21 designates an exhaust tube.

Figure 2:
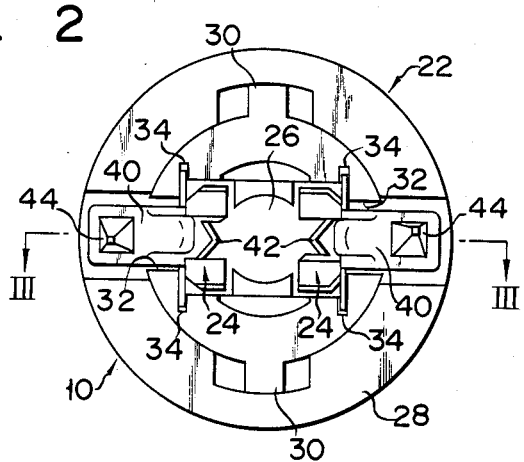
Figure 3:
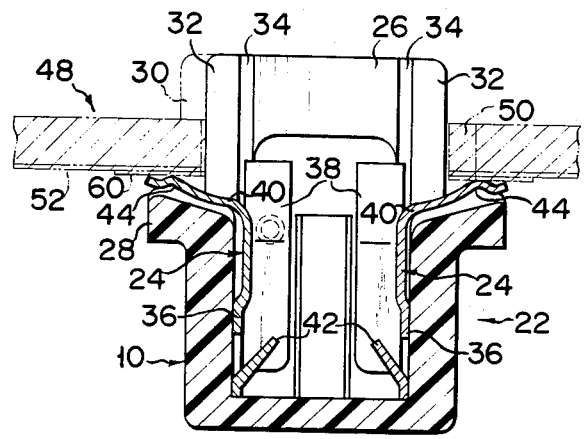

The socket 10, as shown in FIGS. 1 to 3, includes a socket body 22 made of a synthetic resin and a pair of contact members 24. The socket body 22 has a cylindrical form with a bottom. It has a bulb insertion cavity 26, into which the sealed section 14 of the bulb 12 is inserted. It also has a flange 28 formed on its entire outer periphery. The socket body 22 further has a pair of clamp sections 30 formed above and facing the flange 28. A mounting base to be described later is clamped between the flange 28 and clamp sections 30. The socket body 22 has a pair of slits 32 which extend from its top to the flange 28. These slits 32 are opposite each other and located between the clamp sections 30, respectively. Two pair of fitting grooves 34 are formed on the inner surface of the insertion cavity 26 along the side edges of the slits 36.

Figure 4:
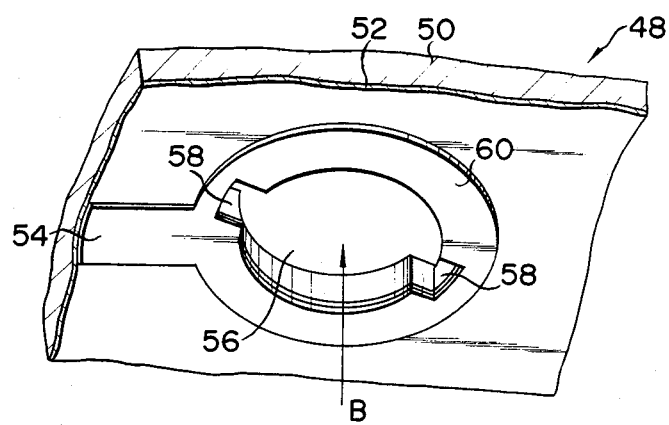

The socket body 22 is mounted to a mounting base 48 as shown in FIG. 4. The mounting base 48 consists of a base 50 made of a synthetic resin or the like, a flexible film 52 of a polyester resin or the like bonded on the base, and a printed wiring 54 formed from a copper foil or the like on the flexible film 52. The mounting base 48 has an insertion hole 56, through which an upper portion of the socket body 22 is inserted. The hole 56 has notches 58 through which the clamp sections 30 of the socket body 22 can pass. The printed wiring 54 has a ring-like contact section 60 surrounding the hole 56. The socket body 22 is inserted through the hole 56 in the direction of arrow B with the clamp sections 30 facing the notches 58 and then is rotated in a predetermined direction, whereby the mounting base 48 is clamped between the flange 28 and clamp sections 30, i.e., the socket body 22 is secured to the mounting base.

The pair of contact members 24 have an identical shape and are symmetrically disposed.

As shown in FIGS. 1 and 3, the contact member 24 has a flat portion 36, a pair of elastic contact portions 38 formed by bending opposite side portions of the flat portion and a power supply terminal 40 upwardly extending from the upper end of the flat portion between the pair of elastic contact portions, these portions being integral with one another. The opposite side edges of the flat portion 36 are inserted into the fitting grooves 34 from above, whereby the contact member 24 is positioned with respect to the socket body 22. The contact member 24 further has a pair of locking pawls 41 projecting from the opposite side edges of the lower end portion of the flat portion 36. These locking pawls 41 are engaged in the grooves 34 to prevent detachment of the contact member 24 from the socket body 22.

When the contact member 24 is mounted to the socket body 22, the elastic contact portions 38 are found in the bulb insertion cavity 26, while the power supply terminal 40 extends through the slit 32 to above the flange 28. In this state, the sealed section 14 of the bulb 12 is inserted into the bulb insertion cavity 26. At this time, the sealed section 14 is clamped between the elastic contact portions 38, whereby the bulb 12 is mechanically supported. At the same time, the leads 18 are electrically connected to the elastic contact portions 38 brought into contact with them. As is clearly seen from FIGS. 2 and 3, the flat portion 36 has a stopper 42 projecting from its central lower portion. The stopper 42 engages the lower end of the sealed section 14, whereby the bulb 12 is positioned accordingly.

The power supply terminal 40 has a contact protuberance 44 formed on its free end portion. When the socket body 22 is mounted to the mounting base 48, the protuberance 44 is brought into electric contact with the contact section 60 of the printed wiring 54, as shown in FIG. 3.

Figure 5:
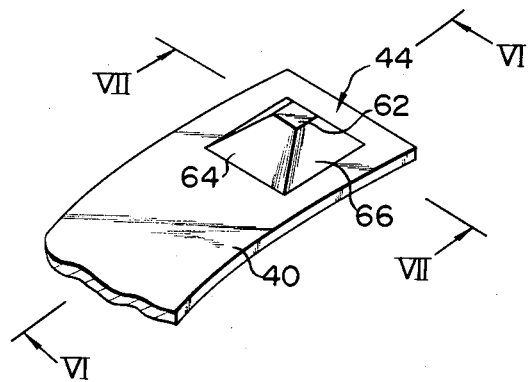
Figure 6:
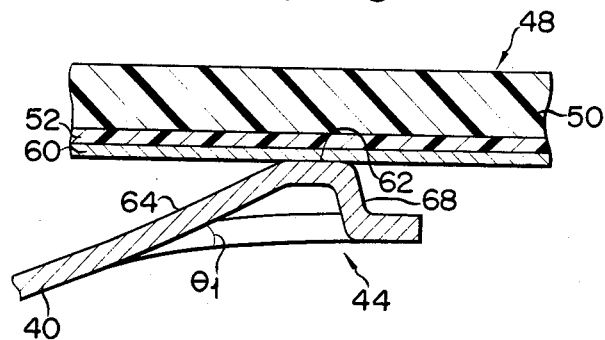
Figure 7:
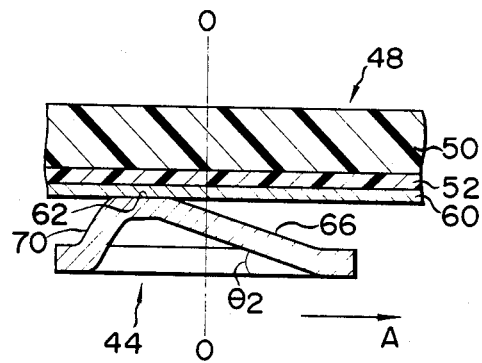

As shown in FIGS. 5 to 7, the protuberance 44 has a rectangular flat top surface 62, which is in contact with the contact section 60 of the mounting base 48, and four inclined side surfaces 64 to 70 each extending from each edge of the flat top surface 62 to the surface of the end portion of the power supply terminal 40. Of the four inclined side surfaces 64 to 70 the first inclined side surface 64 extending from the top surface 62 toward the base end of the power supply terminal 40 and second inclined side surface 66 from the top surface in the direction of rotation of the socket body 22 (shown by arrow A) are inclined gently with respect to the surface of the power supply terminal. The inclination angles $\theta 1$ and $\theta 2$ of the first and second inclined side surfaces 64 and 66 are about 20 to 30 degrees. The first and second inclined side surfaces 64 and 66 are inclined more gently than the third and fourth inclined side surfaces 68 and 70 and also than the side surface of a conventional semicircular contact protuberance. For this reason, the top surface 62 is slightly shifted from the center line O—O of the power supply terminal 40 in the direction opposite to the rotating direction A of the socket body 22.

With the embodiment of the above construction, when the socket 10 is inserted through the bulb insertion hole 56 of the mounting base 48 in the direction of arrow B, the contact protuberance 44 on the power supply terminal 40 of each contact member 24 is brought into contact with the contact section 60 of the printed wiring 54. When the socket 10 is turned in this state, it is secured to the mounting base 48, and also the contact protuberances 44 are held in contact with the contact section 60 of the printed wiring 54. Since the contact protuberance 44 has the top flat surface 62, this surface is held in plane contact with the contact section 60. The contact protuberances 44 are thus electrically connected to the contact section 60.

Then, the sealed section 14 of the bulb 12 is inserted into the bulb insertion cavity 26 of the socket body 22. The sealed section 14 thus inserted is clamped between the elastic contact portions 38 to be held in the bulb insertion cavity 26. The leads 18 are electrically connected to the printed wiring 54 via the elastic contact portions 38 and power supply terminals 40.

When the protuberance 44 is urged against the contact section 60, the power supply terminal 40 acts as a leaf spring to urge the contact protuberance against the contact section. The first inclined side surface 64, which is inclined gently from the top surface 62 toward the base end of the power supply terminal 40, can disperse stress to a greater extent than does the third inclined side surface 68 which is more sharply inclined, that is, the former can more readily undergo elastic deformation than the latter. Therefore, the top surface 62 is readily pushed in the direction opposite to the direction of projection of the contact protuberance 44. It is thus possible to reduce the surface pressure applied from the top surface 62 to the contact section 60.

Further, as the socket 10 is turned for mounting it to the mounting base 48, the flat top surface 62 of the contact protuberance 44 slides over the contact section 60 of the printed wiring. Further, when a large frictional resistance is produced against the flat top surface 62, the second inclined side surface 66, which is gently inclined in the direction of rotation of the socket 10 (as shown by arrow A), is elastically deformed, so that the frictional resistance of the top surface is reduced.

For the above reason, the contact protuberance 44 will never cause damage to the printed wiring 54 or separation of the copper foil from the flexible film 52. This eliminates the possibility of a defective contact between the power supply terminal 40 and printed wiring 54 and thus improves the reliability of the socket. Further, the friction and pressure of contact between the contact protuberance 44 and printed wiring 54 are reduced to facilitate the operation of turning the socket body when mounting the socket.

What is claimed is:

1. A socket, into which a sealed section of a baseless lamp with a pair of leads provided on the outer surfaces of the sealed section is inserted, and which is mounted to a mounting base having a printed wiring formed on the surface thereof and an insertion hole, comprising:

a socket body having a bulb insertion cavity for receiving said sealed section of said lamp inserted therein, said socket body being mounted to said mounting base by being inserted through said insertion hole and then turned in a predetermined direction; and a pair of contact members disposed in said bulb insertion cavity, each of said contact members having a pair of elastic contact portions for clamping said sealed section of the lamp inserted in said bulb insertion cavity and being in contact with said leads, and a power supply terminal outwardly extending from said bulb insertion cavity of said socket body, said power supply terminal having a contact protuberance formed on a free end portion thereof and in contact with said printed wiring when said socket body is mounted to said mounting base, said contact protuberance having a flat top surface in contact with said printed wiring, a first inclined side surface extending from said flat top surface toward the base end of said power supply terminal, a second inclined side surface extending from said flat top surface in the direction of rotation of said socket body and third and fourth inclined side surfaces opposed to said first and second inclined side surfaces, respectively, said first and second inclined side surfaces being inclined more gently than said third and fourth inclined side surfaces.

2. The socket according to claim 1, wherein said first and second inclined side surfaces are inclined by 20 to 30 degrees with respect to the surface of said power supply terminal.

3. The socket according to claim 1, wherein said flat top surface is rectangular, and said first to fourth inclined side surfaces extend from the respective four side edges of said rectangular flat top surface.

4. The socket according to claim 1, wherein said socket body has a cylindrical shape with a bottom, said bulb insertion cavity being defined by an inner periphery, said socket body having a flange formed on an outer periphery thereof and a pair of clamp sections formed on the outer periphery thereof and facing said flange, said mounting base being clamped between said clamp sections and said flange.

5. The socket according to claim 1, wherein said power supply terminal portion extends over said flange on a corresponding side of said clamp sections.

* * * * *